United States Patent
Muramatsu et al.

(10) Patent No.: US 6,628,527 B2
(45) Date of Patent: Sep. 30, 2003

(54) MOUNTING STRUCTURE FOR ELECTRONIC PARTS AND MANUFACTURING METHOD THEREOF

(75) Inventors: Shigetsugu Muramatsu, Nagano (JP); Takuya Kazama, Nagano (JP)

(73) Assignee: Shinko Electric Industries Company, Ltd., Nagano (JP)

( * ) Notice: Subject to any disclaimer, the term of this patent is extended or adjusted under 35 U.S.C. 154(b) by 0 days.

(21) Appl. No.: 09/741,481

(22) Filed: Dec. 20, 2000

(65) Prior Publication Data

US 2001/0005313 A1 Jun. 28, 2001

(30) Foreign Application Priority Data

Dec. 22, 1999 (JP) .......................................... 11-364776

(51) Int. Cl.[7] .............................. H05K 7/02; H05K 1/14; H05K 3/36; H01R 12/00
(52) U.S. Cl. ...................... 361/768; 361/767; 361/803; 361/790; 361/784; 361/760; 29/832; 29/835; 174/52.1; 174/250; 174/260
(58) Field of Search ................................ 361/720, 751, 361/760, 761, 767, 768, 770, 771, 784, 790, 803, 808; 174/250–259, 260, 52.1; 29/832, 835, 840

(56) References Cited

U.S. PATENT DOCUMENTS 5,426,563 A * 6/1995 Moresco et al. ............ 361/689
5,815,374 A * 9/1998 Howell ....................... 361/768

FOREIGN PATENT DOCUMENTS

| JP | 9-214097 | | 8/1997 |
| JP | A-9-214097 | * | 8/1997 |
| JP | 10-135267 | | 5/1998 |

* cited by examiner

Primary Examiner—David Martin
Assistant Examiner—Dameon E. Levi
(74) Attorney, Agent, or Firm—Paul & Paul

(57) ABSTRACT

A unit interconnection substrate for mounting leadless type electronic parts on a mount substrate by superposing them on each other in two or more stages, comprising an insulating surface on the top surface of which an interconnection circuit with conductor pads and connection terminals is formed, depressions for holding electronic parts formed in a bottom surface of the insulating substrate, connection terminals provided on the bottom surface of the insulating substrate on the periphery of the depression, and connection terminals electrically connected to the connection terminals of the top surface of the insulating substrate via conductor via holes provided in the insulating substrate. Electronic parts are electrically connected to the conductor pads on the top surface of the insulating substrate, thereby to make it possible to mount the electronic parts on the insulating substrate. Together with this, holding of the electronic parts mounted on the mount substrate in the depressions of the bottom surface of the insulating substrate is made possible.

4 Claims, 13 Drawing Sheets

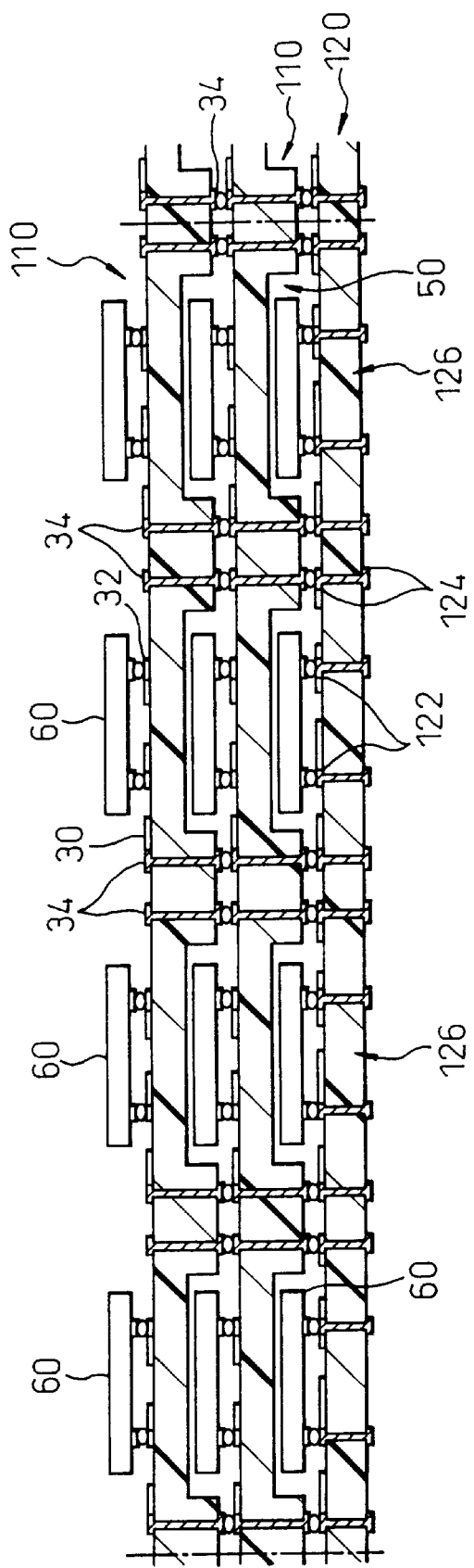

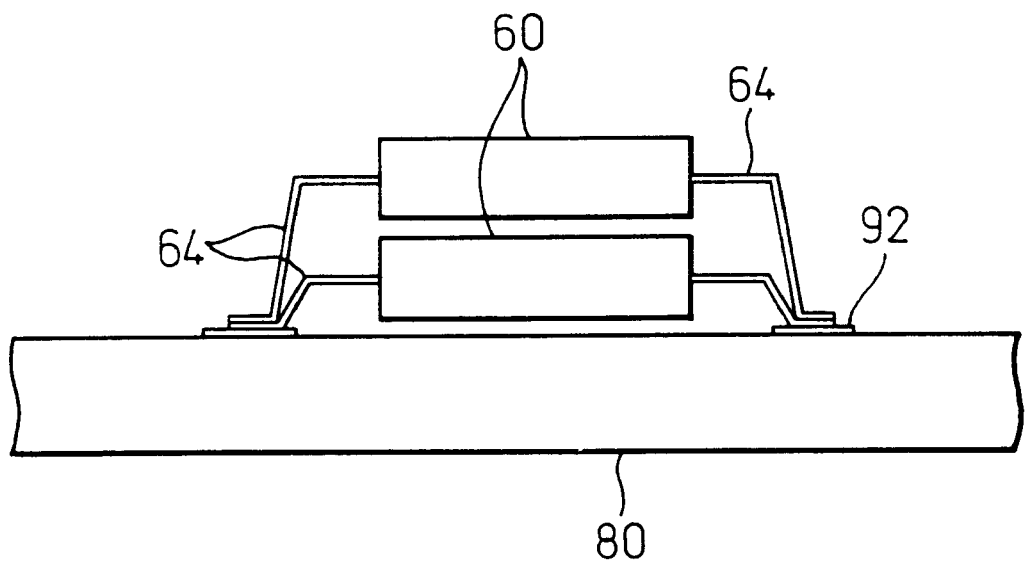

MOUNTING STRUCTURE FOR ELECTRONIC PARTS AND MANUFACTURING METHOD THEREOF

BACKGROUND OF THE INVENTION

1. Field of the Invention

The present invention relates to a unit interconnection substrate and an interconnection substrate for forming a mount structure of electronic parts or an electronic device obtained by mounting a plurality of leadless type semiconductor chips or other electronic parts superposed on each other in two or more stages on a mount substrate, a mount structure of electronic parts and an electronic device formed by using those, a method for mounting electronic parts for forming the mount structure of the electronic parts and a method for manufacturing an electronic device for forming such an electronic device.

2. Description of the Related Art

Conventionally, a mount structure of electronic parts or an electronic device as shown in FIG. 13 has been known.

In this mount structure of electronic parts or electronic device, two or more thin small outline package (TSOP) type semiconductor chips or other electronic parts 60 are superposed on each other on a mount substrate 80. Then, each of the leads 64 extended to the plurality of semiconductor chips or other electronic parts 60 is superposed on each other on conductor pads 92 provided on a top surface of the mount substrate 80 corresponding to those and electrically connected by soldering or the like.

Summarizing the problem to be solved by the invention, recently, for the purpose for improving the electrical characteristics of the semiconductor chips or other electronic parts and the purpose of reducing the mount area of the electronic parts, types have appeared for electrically connecting a semiconductor chip directly to the conductor pads of the mount substrate by a flip chip bonding and surface mounting the semiconductor chip on the mount substrate or types have appeared for electrically connecting a chip size package (CSP) type semiconductor device to the conductor pads of the mount substrate and surface mounting the semiconductor device on the mount substrate. These are employed in many electronic apparatuses.

In a semiconductor chip or semiconductor substrate of the type to be surface mounted on this mount substrate, the leads are not extended, so it is impossible to mount two or more leadless type semiconductor chips or semiconductor devices or other electronic parts superposed on the mount substrate.

SUMMARY OF THE INVENTION

An object of the present invention is to provide a unit interconnection substrate and an interconnection substrate for mounting a plurality of leadless type electronic parts as described above superposed in two or more stages on a mount structure, a mount structure of electronic parts and an electronic device formed by using the same, a method for mounting electronic parts for forming the mount structure of the electronic parts, and a method for manufacturing an electronic device for forming an electronic device.

To attain the above object, according to a first aspect of the present invention, there is provided a unit interconnection substrate comprised of an insulating substrate, an interconnection circuit provided with connection terminals and conductor pads provided on a top surface of the insulating substrate, a depression for holding an electronic part formed in a bottom surface of the insulating substrate, and connection terminals provided on the bottom surface of the insulating substrate on the periphery of the depression, the connection terminals being electrically connected to the connection terminals provided on the interconnection circuit via conductor through holes or conductor via holes provided in the insulating substrate.

Preferably, a plurality of unit interconnection substrates of the present invention are integrally formed arranged in many columns or one column.

According to a second aspect of the present invention, there is provided a first mount structure of electronic parts wherein an electronic part is electrically connected to conductor pads provided on interconnection circuits of the top surface of a unit interconnection substrate or other interconnection substrate, the electronic part is mounted on the unit interconnection substrate or interconnection substrate, the connection terminals of the bottom surface of the unit interconnection substrate or the interconnection substrate are electrically connected to the corresponding connection pads of the mount substrate, and, at the same time, the electronic part mounted on the mount substrate is held in a depression in the bottom surface of the unit interconnection substrate or interconnection substrate.

According to a third aspect of the present invention, there is provided a second mount structure of electronic parts wherein an electronic part is electrically connected to conductor pads provided on an interconnection circuit of a top surface of an unit interconnection substrate or interconnection substrate, a plurality of the unit interconnection substrates or interconnection substrates with electronic parts mounted thereon are superposed in two or more stages on each other, the connection terminals of vertically superposed unit interconnection substrates or interconnection substrates are electrically connected to each other, an electronic part mounted on a lower unit interconnection substrate or interconnection substrate is held in a depression of the bottom surface of an upper unit interconnection substrate or interconnection substrate, connection terminals of the bottom surface of the lowermost unit interconnection substrate or interconnection substrate among the two or more stages of superposed unit interconnection substrates or interconnection substrates are electrically connected to corresponding connection pads of the mount substrate, and an electronic part mounted on a mount substrate is held in the depression of the bottom surface of the lowermost unit interconnection substrate or interconnection substrate.

According to a fifth aspect of the present invention, there is provided a first electronic device comprising the first mount structure of electronic parts in which, in place of the mount substrate, use is made of a unit interposer or an interposer provided on its top surface with conductor pads for connecting an electronic part and connection pads for connecting connection terminals provided on the bottom surface of the unit interconnection substrate or interconnection substrate and provided on its bottom surface with connection pads for connecting an external electronic circuit electrically connected to the connection pads of the top surface.

According to a sixth aspect of the present invention, there is provided a second electronic device comprising the second mount structure of electronic parts in which, in place of the mount substrate, use is made of a unit interposer or an interposer provided on its top surface with conductor pads for connecting electronic parts and connection pads for connecting connection terminals provided on the bottom surface of the unit interconnection substrate or interconnection substrate and provided on its bottom surface with connection pads for connecting an external electronic circuit electrically connected to the connection pads of the top surface.

According to the first or second mount structure of electronic parts of the present invention or the first or second electronic devices of the present invention, leadless type semiconductor chips or other electronic parts can be mounted via the unit interconnection substrate or the interconnection substrate of the present invention on the mount substrate, the unit interposer, or the interposer superposed on each other in two more stages or leadless type semiconductor chips or other electronic parts can be mounted via the unit interconnection substrate or the interconnection substrate of the present invention on the mount substrate, the unit interposer, or the interposer superposed on each other in three or more stages.

Further, other electronic parts other than the electronic part mounted on the uppermost unit interconnection substrate or the uppermost interconnection substrate can be held in the depressions of the bottom surfaces of the unit interconnection substrates or the interconnection substrates and the electronic parts can be protected by covering the same by the insulating substrates of the unit interconnection substrates or the interconnection substrates so as not to be subjected to external force.

Further, in the first or second electronic device of the present invention, the connection pads provided on the bottom surface of the unit interposer or the interposer can be electrically connected to the corresponding connection pads etc. provided on the mount substrate to mount the first or second electronic device on the mount substrate etc.

In the unit interconnection substrate of the present invention, preferably the depression is a through groove extending from one side face of the insulating substrate to a side face on the opposite side.

In the interconnection substrate of the present invention, preferably the depression is a through groove extending from one side face of the insulating substrate to a side face on the opposite side and formed in a direction perpendicular to a direction wherein the plurality of unit interconnection substrates are arranged in many columns or one column.

In this unit interconnection substrate or interconnection substrate, heat generated by the electronic parts such as the semiconductor chip held in the depression can be efficiently dissipated into the atmosphere on the outside of the insulating substrate through the through groove.

Further, in comparison with a hollow like depression with the periphery surrounded by the insulating substrate, the depression formed by the through groove can be easily and quickly formed in the bottom surface of the insulating substrate by using a router or the like without trouble.

According to seventh aspect of the present invention, there is provided a first method for mounting electronic parts comprising the steps of:

a. electrically connecting electronic parts to conductor pads provided on interconnection circuits of top surfaces of unit interconnection substrates of an interconnection substrate of the present invention and mounting the electronic parts on said interconnection substrate, b. cutting the interconnection substrate between predetermined unit interconnection substrates thereof with said electronic parts mounted thereon to form an interconnection substrates each having a predetermined number of unit interconnection substrates with the electronic parts mounted thereon, and c. electrically connecting the connection terminals provided on a bottom surface of the interconnection substrate having a predetermined number of the unit interconnection substrates with said electronic parts mounted thereon to the corresponding connection pads of the mount substrate and holding the electronic parts mounted on the mount substrate in the depressions of the bottom surface of said interconnection substrate.

In this first mount method of electronic parts, the first mount structure of the electronic parts of the present invention formed by mounting a plurality of electronic parts on the mount substrate superposed on each other in two stages and laterally arranged can be easily formed without trouble.

According to an eighth aspect of the present invention, there is provided a second method for mounting electronic parts comprising the steps of:

a. forming at least two structures each obtained by electrically connecting electronic parts to conductor pads provided on interconnection circuits of top surfaces of unit interconnection substrates of an interconnection substrate and mounting the electronic parts on said interconnection substrate, b. superposing the interconnection substrates with the electronic parts mounted thereon superposed on each other in two or more stages and electrically connecting the connection terminals of upper and lower superposed interconnection substrates each other and, at the same time, holding the electronic parts mounted on the lower interconnection substrates in the depressions of the bottom surface of the upper interconnection substrate, c. vertically cutting said interconnection substrates superposed on each other in two or more stages between predetermined unit interconnection substrates thereof to form interconnection substrates each having the predetermined number of the unit interconnection substrates with the electronic parts mounted thereon superposed on each other in two or more stages, and d. electrically connecting the connection terminals provided on the bottom surface of the lowermost interconnection substrate among the interconnection substrates each having the predetermined number of the unit interconnection substrates superposed on each other in two or more stages to the corresponding connection pads of the mount substrate and, at the same time, holding the electronic parts mounted on the mount substrate in the depressions of the bottom surface of said lowermost interconnection substrate.

In this second mount method of the electronic parts, the second mount structure of the electronic parts of the present invention formed by mounting a plurality of electronic parts on the mount substrate via the interconnection substrate having the predetermined number of the unit interconnection substrates superposed on each other in three or more stages and arranged in a lateral direction or the like can be easily formed without trouble.

A method of manufacture of the first electronic device of the present invention comprises the steps of:

a. electrically connecting electronic parts to conductor pads provided on interconnection circuits of top surfaces of unit interconnection substrates of the interconnection substrate of the present invention and mounting the electronic parts on said interconnection substrate, b. electrically connecting the connection terminals provided on the bottom surface of said interconnection substrate to the connection pads of the top surface of an interposer and holding the electronic parts mounted on the interposer in the depressions of the bottom surface of said interconnection substrate electrically connected to the conductor pads of the top surface of said interposer, and c. vertically cutting the interconnection substrate with said electronic parts mounted thereon and unit interposers beneath the same, between predetermined unit interconnection substrates of the interconnection substrate.

In this method of manufacture of the first electronic device, the first electronic device formed by mounting a plurality of electronic parts on the unit interposer or the interposer via the interconnection substrate having the predetermined number of unit interconnection substrates superposed on each other in two stages and arranged laterally or the like can be easily formed without trouble.

Further, the method of manufacture of the second electronic device of the present invention comprises the steps of:

a. forming at least two structures each obtained by electrically connecting electronic parts to conductor pads provided on interconnection circuits of top surfaces of unit interconnection substrates of an interconnection substrate and mounting the electronic parts on said interconnection substrate, b. superposing the interconnection substrates with the electronic parts mounted thereon on each other in two or more stages and electrically connecting the connection terminals of the upper and lower superposed interconnection substrates superposed to each other and, at the same time, holding the electronic parts mounted on a lower interconnection substrate in the depressions of the bottom surface of an upper interconnection substrate, c. electrically connecting the connection terminals provided on the bottom surface of the lowermost interconnection substrate of said interconnection substrates superposed on each other in two or more stages to the connection pads of the top surface of an interposer and, at the same time, holding the electronic parts mounted on the interposer connected to the conductor pads of the top surface of said interposer in the depressions of the bottom surface of said lowermost interconnection substrate, and d. vertically cutting said interconnection substrates superposed on each other in two or more stages and the unit interposers beneath the same, between predetermined unit interconnection substrates of the interconnection substrate.

In this method of manufacture of the second electronic device, the second electronic device of the present invention formed by mounting a plurality of electronic parts on a unit interposer or interposer via the interconnection substrate having the predetermined number of the unit interconnection substrates superposed on each other in three or more stages and arranged laterally or the like can be easily formed without trouble.

BRIEF DESCRIPTION OF THE DRAWINGS

These and other objects and features of the present invention will become clearer from the following description of the preferred embodiments given with reference to the accompanying drawings, wherein:

FIG. 12 is an explanatory view of steps of a method of manufacturing the second electronic device of the present invention; and FIG. 13 is a front view of a conventional mount structure of electronic parts.

DESCRIPTION OF THE PREFERRED EMBODIMENTS

Figure 1:
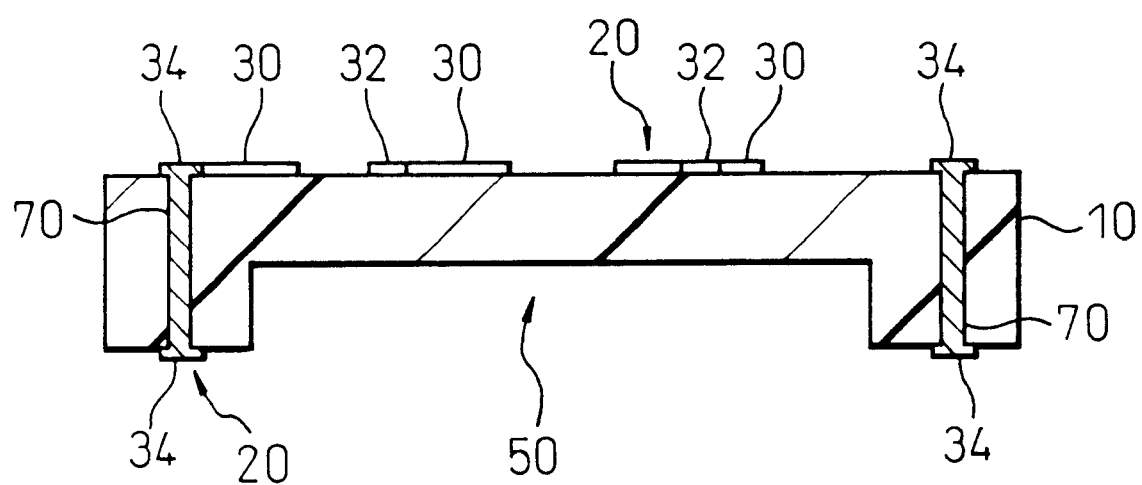
FIG. 1 is a front sectional view of a unit interconnection substrate of the present invention.

FIG. 1 shows a preferred embodiment of a unit interconnection substrate of the present invention. FIG. 1 is a front sectional view. Below, this unit interconnection substrate will be explained.

The unit interconnection substrate of the figure is formed by using a two-sided copper bonded laminated plate.

Concretely, interconnection circuits 30 with connection terminals 34 and conductor pads 32 provided on a top surface of an insulating substrate 10 are formed by patterning a copper foil 20 bonded to the top surface of the insulating substrate 10 made of a two-sided copper bonded laminated plate.

Together with this, the copper foil 20 bonded to the bottom surface of the insulating substrate 10 made of the two-sided copper bonded laminated plate is patterned to form the connection terminals 34 on the bottom surface of the insulating substrate 10.

In the bottom surface of the insulating substrate 10 closer to the inside than the connection terminals 34, a depression 50 for holding electronic parts such as one or leadless type semiconductor chips is formed by spot facing using a router or the like.

In the portion of the insulating substrate 10 outside from than the depression 50, conductor through holes or conductor via holes (conductor via holes in the figure) 70 are formed for electrically connecting the connection terminals 34 provided on the interconnection circuits 30 formed on the top surface of the insulating substrate 10 and the connection terminals 34 on the bottom surface of the insulating substrate 10.

The unit interconnection substrate shown in FIG. 1 is constituted as described above.

Figure 2:
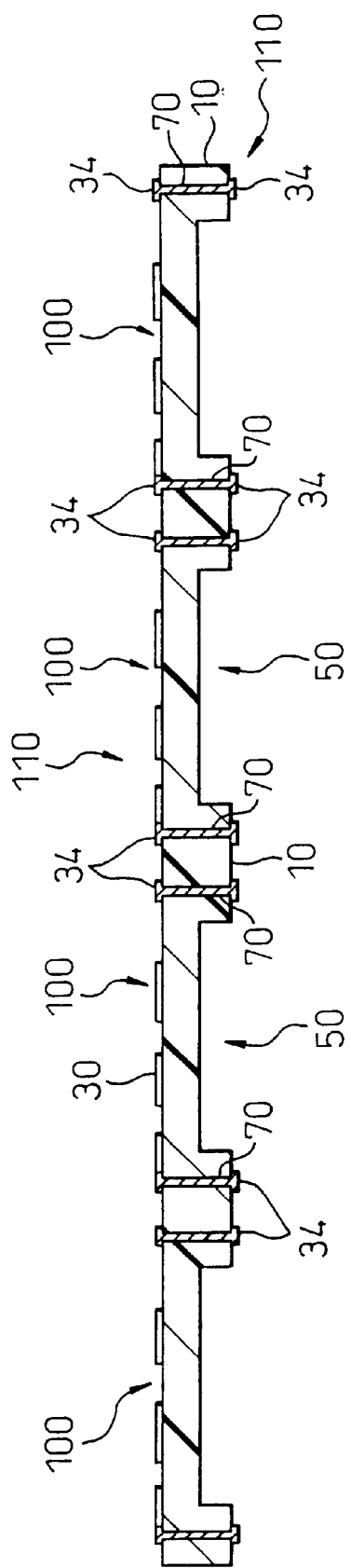
FIG. 2 is a front sectional view of an interconnection substrate of the present invention.

FIG. 2 shows a preferred embodiment of the interconnection substrate of the present invention. FIG. 2 is a front sectional view. Below, this interconnection substrate will be explained.

The interconnection substrate of the figure is formed by continuously integrally arranging a plurality of unit interconnection substrates 100 shown in FIG. 1 in a lateral direction in many columns or one column.

The rest of the portions are formed similar to the unit interconnection substrate shown in FIG. 1.

In the unit interconnection substrate shown in FIG. 1, preferably the depression 50 for holding the electronic parts is formed as a through groove extending from one side face of the insulating substrate 10 to the side face on the opposite side.

In the interconnection substrate shown in FIG. 2, preferably the depression 50 for holding the electronic parts is formed as a through groove extending from one side face of the insulating substrate 10 to the side face on the opposite side and formed in a direction perpendicular to the direction wherein the plurality of unit interconnection substrates 100 are arranged in many columns or one column.

In this unit interconnection substrate or interconnection substrate, the heat generated by the electronic parts such as the semiconductor chip held in the depression 50 can be efficiently dissipated into the atmosphere or the like at the outside of the insulating substrate 10 through the through groove.

Further, the depression 50 formed by the through groove can be easily and quickly formed in the bottom surface of the insulating substrate 10 by using a router or the like without trouble.

Figure 3:
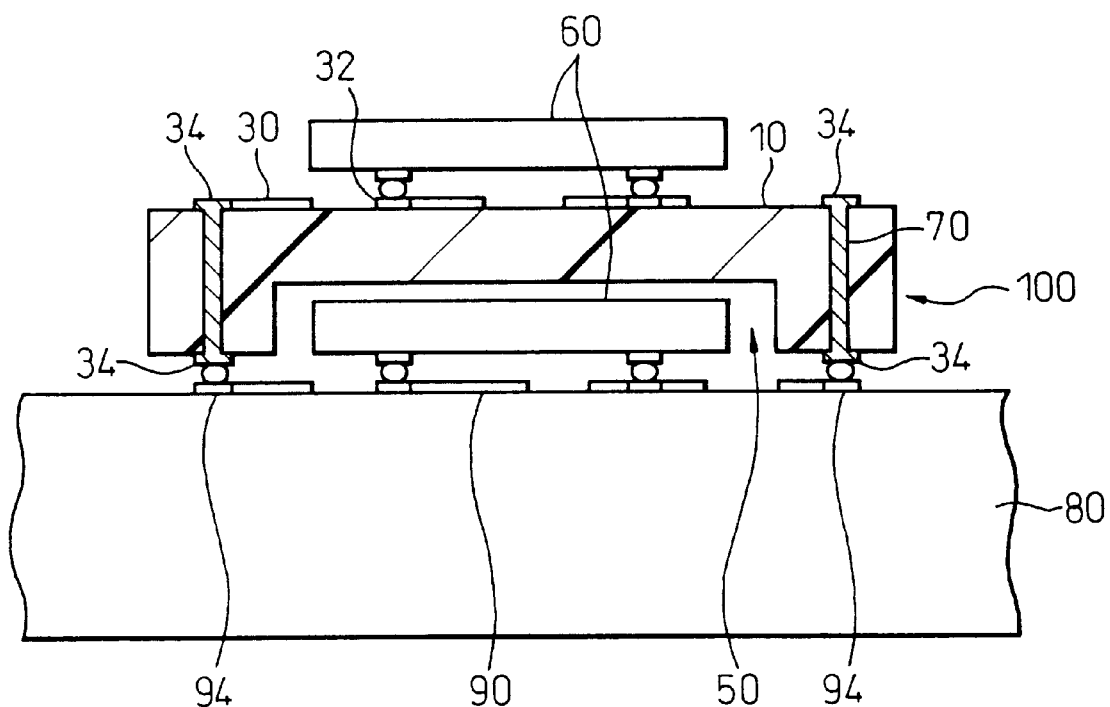
FIG. 3 is a front sectional view of a first mount structure of electronic parts of the present invention.
Figure 4:
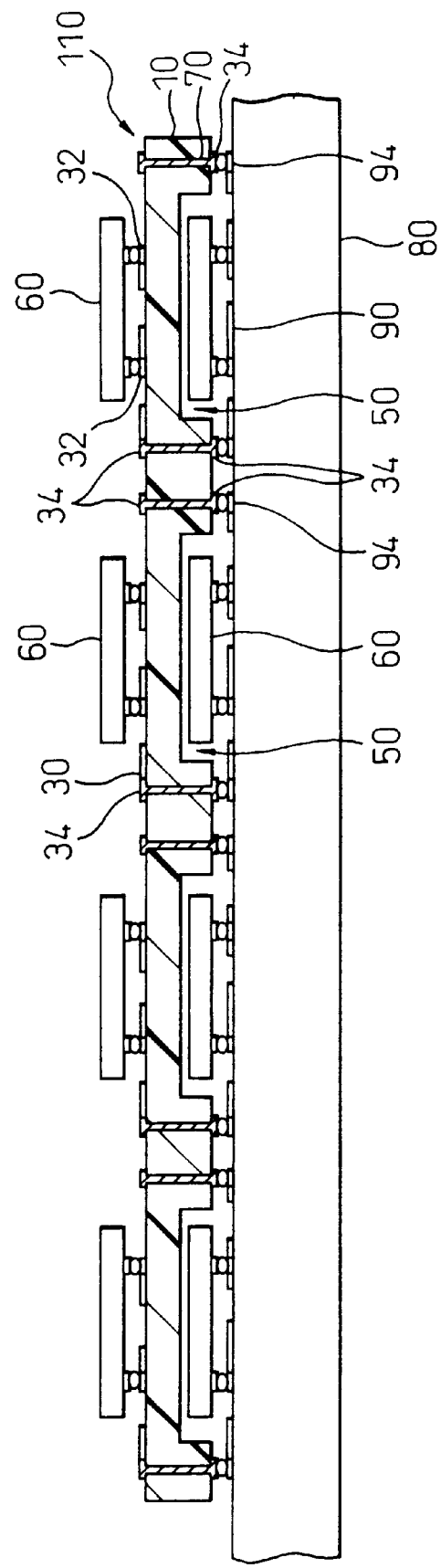
FIG. 4 is a front sectional view of the first mount structure of electronic parts of the present invention.

FIG. 3 or FIG. 4 show a preferred embodiment of a first mount structure of the electronic parts of the present invention. FIG. 3 or FIG. 4 are front sectional views thereof. Below, this first mount structure of the electronic parts will be explained.

In the first mount structure of electronic parts shown in FIG. 3, an electronic part 60 such as a semiconductor chip is electrically connected to the conductor pads 32 provided on the interconnection circuits 30 on the top surface of the unit interconnection substrate 100 shown in FIG. 1. Then, the electronic part 60 is mounted on the unit interconnection substrate 100.

With respect to that, in the mount structure of the electronic parts shown in FIG. 4, an electronic part 60 such as a semiconductor chip is electrically connected to the conductor pads 32 provided on the interconnection circuit 30 on the top surface of the interconnection substrate 110 shown in FIG. 2. Then, the electronic part 60 is mounted on the interconnection substrate 110.

The connection terminals 34 provided on the bottom surface of the unit interconnection substrate 100 or the interconnection substrate 110 are electrically connected to corresponding connection pads 94 provided on the top surface of the mount substrate 80 by soldering or the like. Then, the interconnection circuit 30 formed on the top surface of the unit interconnection substrate 100 or the interconnection substrate 110 is electrically connected to the interconnection circuit 90 of the mount substrate 80 via the conductor through holes or the conductor via holes 70 formed in the insulating substrate 10.

In the depression 50 of the bottom surface of the unit interconnection substrate 100 or the interconnection substrate 110, one or more semiconductor chips or other electronic parts 60 mounted on the mount substrate 80 are held.

Then, in the mount structure of the electronic parts shown in FIG. 3, a plurality of electronic parts 60 are mounted on the mount substrate 80 via the unit interconnection substrate 100 superposed on each other in two stages.

As opposed to this, in the mount structure of the electronic parts shown in FIG. 4, a plurality of electronic parts 60 are mounted on the mount substrate 80 via the interconnection substrate 110 superposed on each other in two stages.

The first mount structure of electronic parts shown in FIG. 3 or FIG. 4 is constituted as described above.

Figure 5:
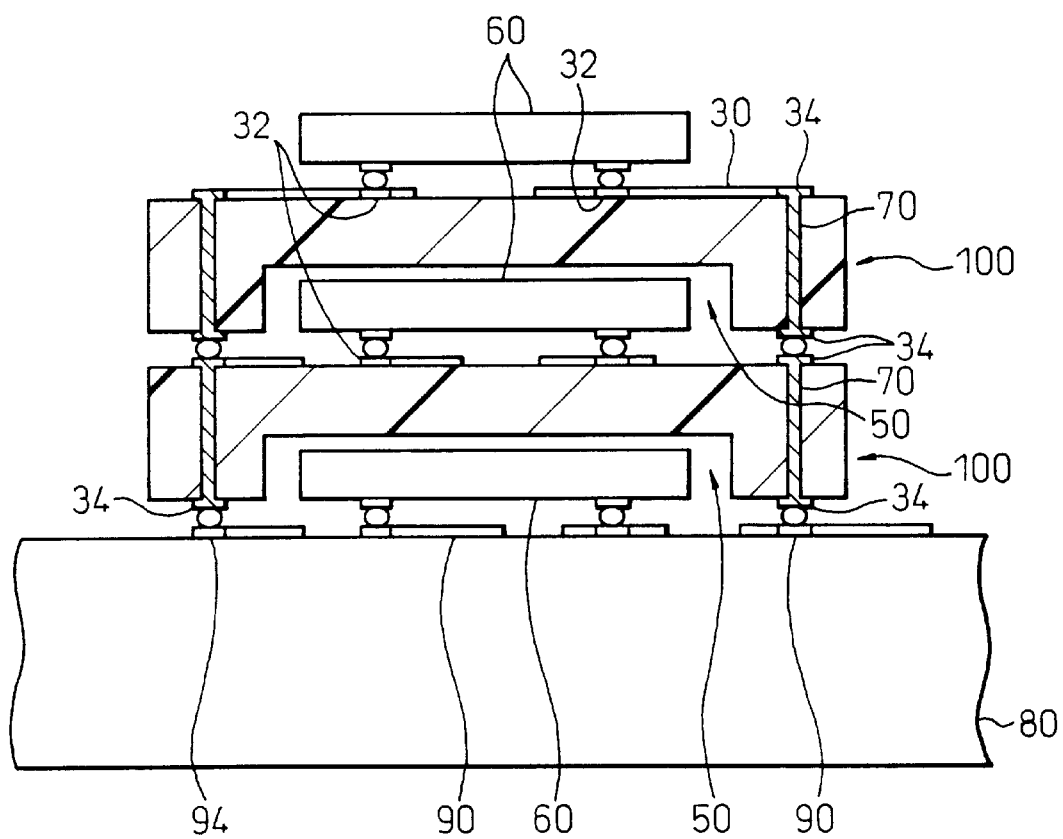
FIG. 5 is a front sectional view of a second mount structure of electronic parts of the present invention.
Figure 6:
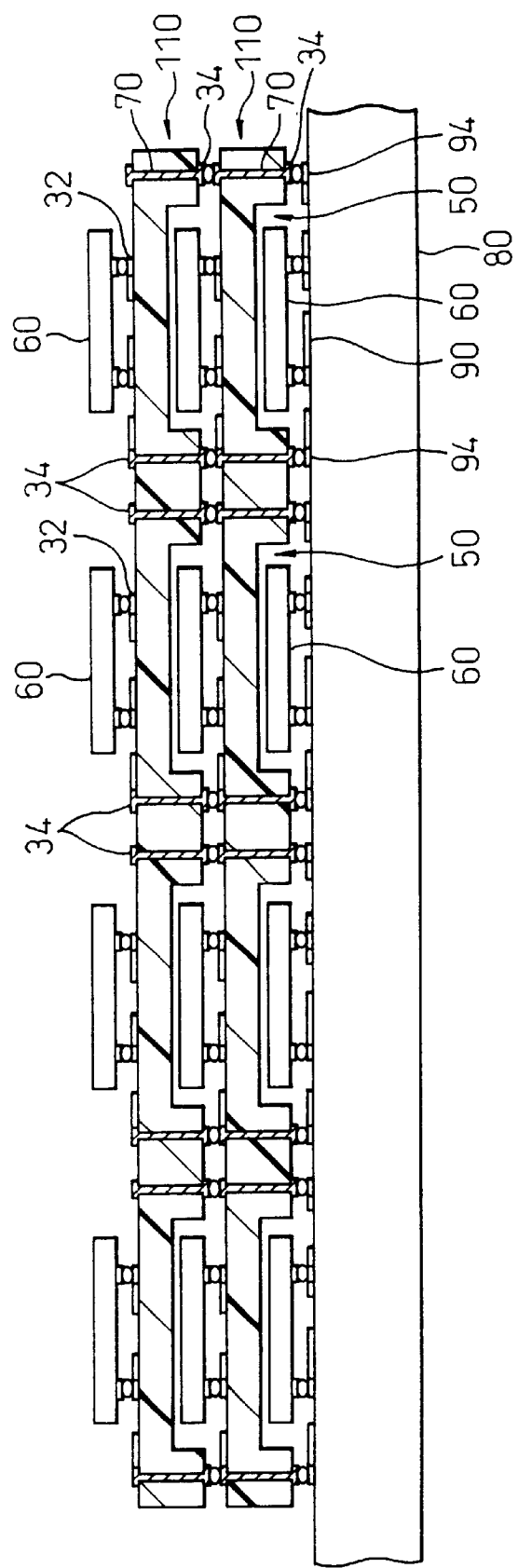
FIG. 6 is a front sectional view of the second mount structure of electronic parts of the present invention.

FIG. 5 or FIG. 6 shows a preferred embodiment of the second mount structure of electronic parts of the present invention. FIG. 5 or FIG. 6 is a front sectional view thereof. Below, this second mount structure of the electronic parts will be explained.

In the second mount structure of the electronic parts shown in FIG. 5, semiconductor chips or other electronic parts 60 are electrically connected to the conductor pads 32 provided on the interconnection circuits 30 of the top surfaces of the unit interconnection substrates 100 shown in FIG. 1, and the electronic parts 60 are mounted on the unit interconnection substrates 100. These structures are superposed on each other in two or more stages (two stages in the figure). Then, the connection terminals 34 of the unit interconnection substrates 100 vertically superposed on each other are electrically connected by soldering or the like.

As opposed to this, in the second mount structure of the electronic parts shown in FIG. 6, semiconductor chips or other electronic parts 60 are electrically connected to the conductor pads 32 provided on the interconnection circuits 30 of the top surfaces of the interconnection substrates 110 shown in FIG. 2, and the electronic parts 60 are mounted on the interconnection substrate 110. These structures are superposed on each other in two or more stages (two stages in the figure). Then, the connection terminals 34 of the interconnection substrates 110 vertically superposed on each other are electrically connected by soldering or the like.

The connection terminals 34 of the bottom surface of the lowermost unit interconnection substrate 100 or interconnection substrate 110 among the unit interconnection substrates 100 or interconnection substrates 110 superposed on each other in two or more stages are electrically connected to the corresponding connection pads 94 provided on the top surface of the mount substrate 80 by soldering or the like.

In the depression 50 of the bottom surface of the lowermost unit interconnection substrate 100 or interconnection substrate 110 among the unit interconnection substrates 100 or interconnection substrates 110 superposed on each other in two or more stages, the semiconductor chips or other electronic parts 60 mounted on the mount substrate 80 are held.

Then, in the mount structure of electronic parts shown in FIG. 5, a plurality of electronic parts 60 are mounted on the mount substrate 80 via two or more unit interconnection substrates 100 while being superposed on each other in three or more stages.

As opposed to this, in the mount structure of electronic parts shown in FIG. 6, a plurality of electronic parts 60 are mounted on the mount substrate 80 via two or more interconnection substrates 110 while being superposed on each other in three or more stages and arranged in the lateral direction.

The second mount structure of electronic parts shown in FIG. 5 or FIG. 6 is constituted as described above.

Figure 7:
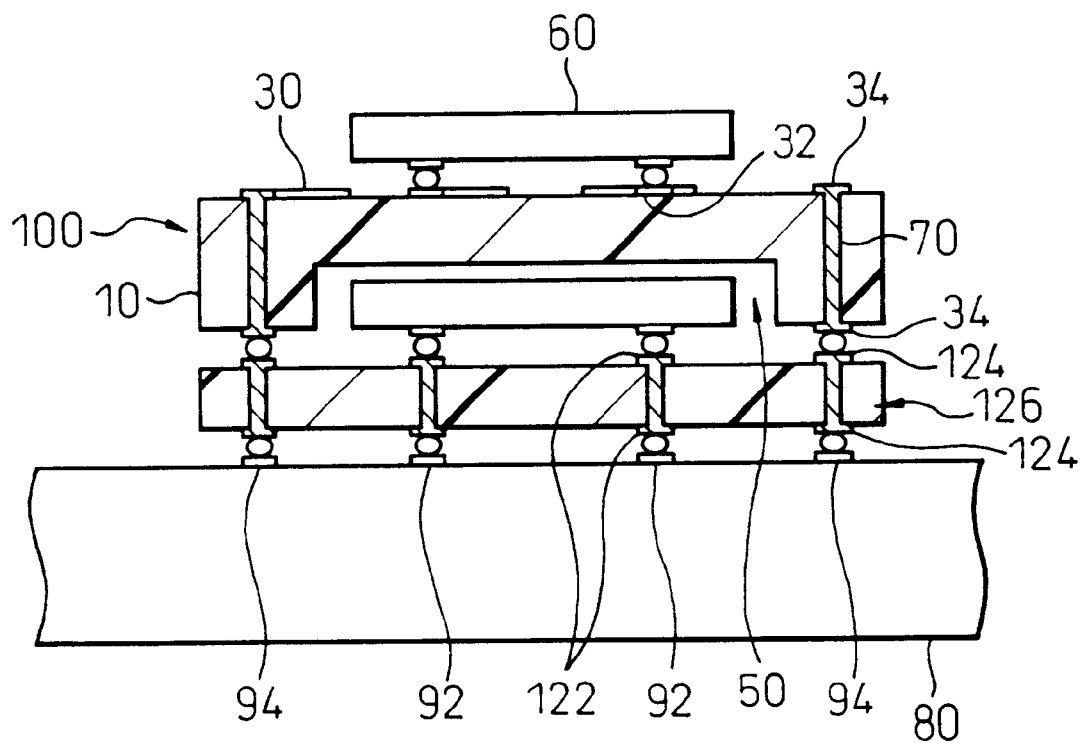
FIG. 7 is a front sectional view showing a usage state of a first electronic device of the present invention.

FIG. 7 shows a preferred embodiment of the first electronic device of the present invention. FIG. 7 is a front sectional view showing the usage state thereof. Below, this first electronic device will be explained.

In this first electronic device, in the first mount structure of the electronic parts shown in FIG. 3 or FIG. 4 (FIG. 3 in the figure), instead of the mount structure 80, use is made of a unit interposer 126 or an interposer 120 (unit interposer in the figure) provided at the top surface with connection pads 122 for connecting the electronic parts 60 and connection pads 124 for connecting the connection terminals 34 of the bottom surface of the unit interconnection substrate 100 or interconnection substrate 110 (unit interconnection substrate in the figure) and provided at the bottom surface with connection pads 124 for connecting the external electronic circuit electrically connected to the connection pads 124 on the top surface via the conductor via holes or the like.

Here, a unit interposer means a unit interconnection substrate having a simple structure formed by providing conductor pads or connection pads on the top and bottom surfaces of the insulating substrate and electrically connecting the conductor pads and the connection terminals of the top and bottom surfaces of the insulating substrate to each other by the conductor through holes or conductor via holes formed in the insulating substrate.

Further, an interposer means an interconnection substrate integrally formed by arranging a plurality of unit interposers in many columns or one column.

The rest of the portions are constituted similar to the first mount structure of the electronic parts shown in FIG. 3 or FIG. 4.

Figure 8:
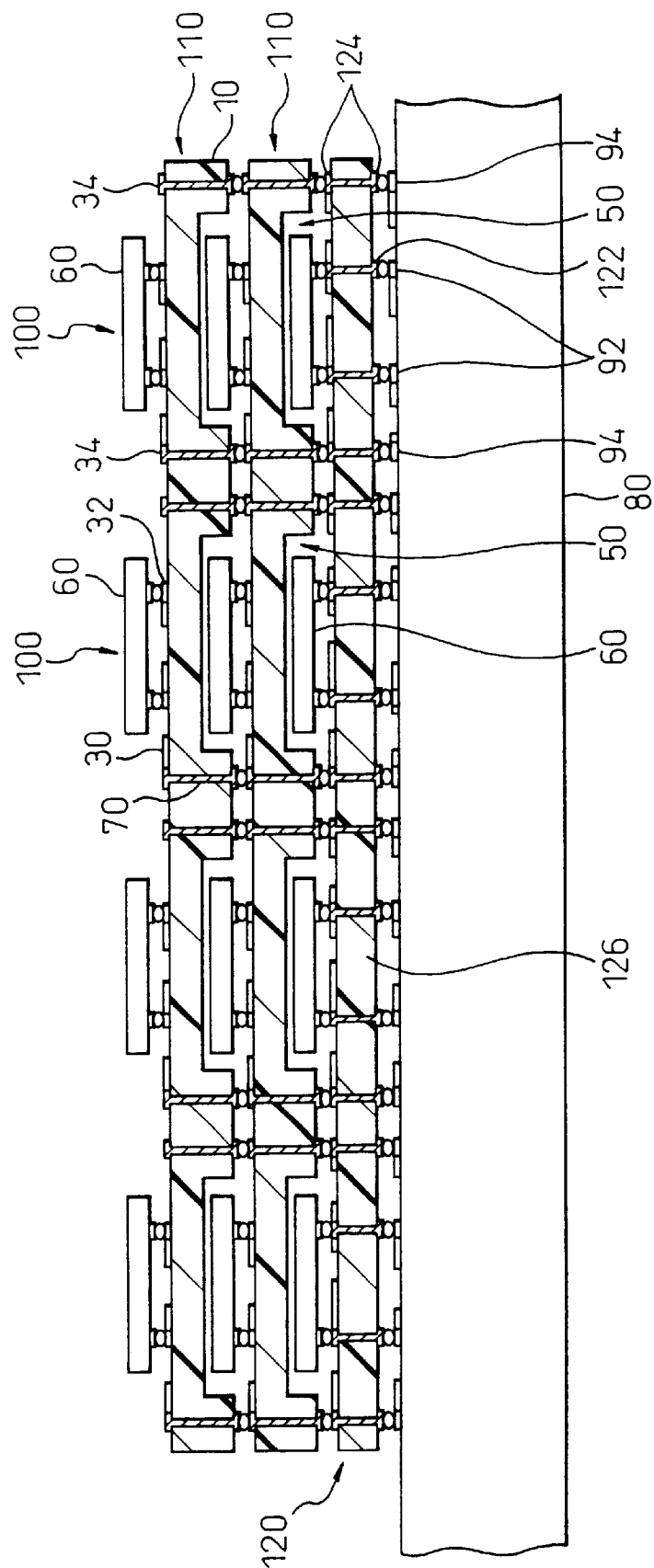
FIG. 8 is a front sectional view showing a usage state of a second electronic device of the present invention.

FIG. 8 shows a preferred embodiment of the second electronic device of the present invention. FIG. 8 is a front sectional view showing the usage state thereof. Below, this second electronic device will be explained.

In this second electronic device, in the second mount structure of the electronic parts shown in FIG. 5 or FIG. 6 (FIG. 6 in the figure), instead of the mount substrate 80, use is made of a unit interposer 126 or interposer 120 (unit interposer in the figure) provided at its top surface with connection pads 122 for connecting the electronic parts 60 and connection pads 124 for connecting the connection terminals 34 of the bottom surface of the unit interconnection substrate 100 or interconnection substrate 110 (unit interconnection substrate in the figure) and provided at its bottom surface with connection pads 124 for connecting the external electronic circuit electrically connected to the connection pads 124 of the top surface.

The unit interposer or interposer is similar to those mentioned before.

The rest of the configuration is similar to the second mount structure of electronic parts shown in FIG. 5 or FIG. 6.

In this first or second mount structure of electronic parts or first or second electronic device, a plurality of leadless type semiconductor chips or other electronic parts 60 can be mounted on the mount substrate 80, unit interposer 126, or the interposer 120 via the unit interconnection substrate 100 or the interconnection substrate 110 while being superposed on each other in two stages, or a plurality of leadless type semiconductor chips or other electronic parts 60 can be mounted on the mount substrate 80, unit interposer 126, or the interposer 120 via the unit interconnection substrate 100 or the interconnection substrate 110 while being superposed on each other in three or more stages.

Further, the electronic parts 60 other than the electronic part 60 mounted on the uppermost unit interconnection substrate 100 or the uppermost interconnection substrate 110 are held in the depressions 50 of the bottom surfaces of the unit interconnection substrates 100 or the interconnection substrates 110, so the electronic parts 60 can be protected by covering by the insulating substrates 10 of the unit interconnection substrates 100 or the interconnection substrates 110 without being subjected to external force.

Further, in the first or second electronic device, as shown in FIG. 7 or FIG. 8, the connection pads 124 provided on the bottom surface of the unit interposer 126 or the interposer 120 thereof are electrically connected to the corresponding connection pads 94 etc. provided on the mount substrate 80 and the first or second electronic device can be mounted on the mount substrate 80 or the like.

Next, a preferred embodiment of the first method for mounting the electronic parts of the present invention will be explained.

Figure 9:
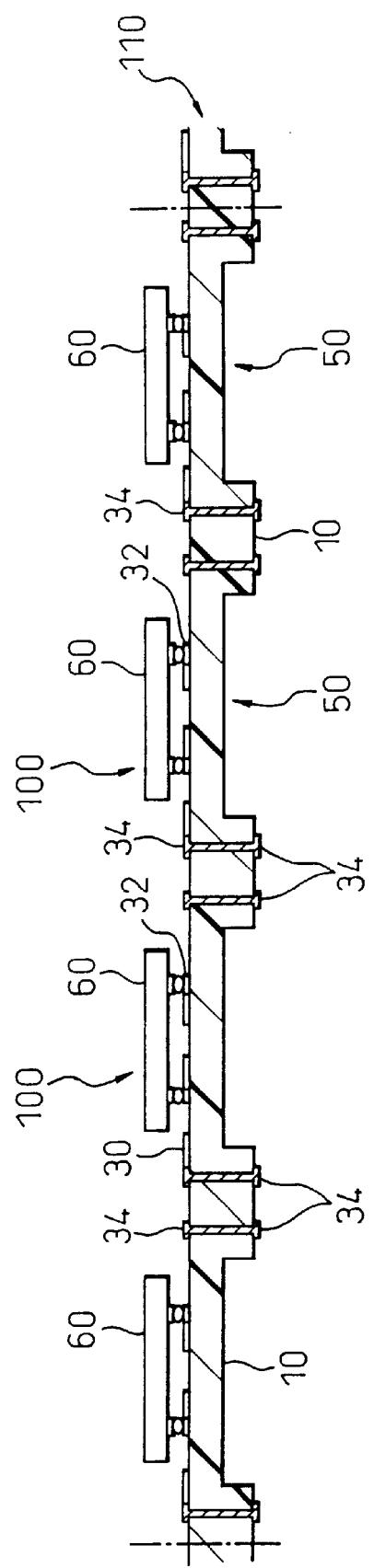
FIG. 9 is an explanatory view of steps of a first method for mounting electronic parts of the present invention.

In this first method of mounting electronic parts, as shown in FIG. 9, each of the plurality of leadless type semiconductor chips or other electronic parts 60 is electrically connected to conductor pads 32 provided on the interconnection circuits 30 of the top surface of each unit interconnection substrate 100 of the interconnection substrate 110 shown in FIG. 2. Then, the plurality of electronic parts 60 are mounted on the interconnection substrate 110.

Then, step a of the first mount method of the electronic parts of the present invention is carried out.

Then, as indicated by the one-dot chain line in FIG. 9, predetermined unit interconnection substrates 100 of the interconnection substrate 110 with the plurality of electronic parts 60 mounted and arranged thereon are cut while by using a slicer or the like. Then, the interconnection substrate 110 having the predetermined number of the unit interconnection substrates 100 with the electronic parts 60 mounted thereon is formed.

Then, step b of the first mount method of the electronic parts of the present invention is carried out.

Thereafter, as shown in FIG. 4, the connection terminals 34 provided on the bottom surface of the interconnection substrate 110 having the predetermined number of the unit interconnection substrates 100 with the electronic parts 60 mounted thereon are electrically connected to the corresponding connection pads 94 on the top surface of the mount substrate 80 by soldering or the like.

Together with this, the plurality of electronic parts 60 arranged and mounted on the mount substrate 80 are held in the depressions 50 arranged in the bottom surface of the interconnection substrate 110.

Then, step c of the first mount method of the electronic parts of the present invention is carried out.

Then, the first mount structure of the electronic parts as shown in FIG. 4 formed by mounting the plurality of electronic parts 60 on the mount substrate 80 while being superposed on each other in two stages and laterally arranged is obtained.

This first mount method of the electronic parts comprises the above steps.

In this first mount method of the electronic parts, the first mount structure of the electronic parts of the present invention formed by mounting the plurality of electronic parts 60 on the mount substrate 80 while being superposed on each other in two stages and arranged in the lateral direction via the interconnection substrate 110 having the predetermined number of the unit interconnection substrates 100 can be easily formed without trouble.

Next, an explanation will be made of a preferred embodiment of the second mount method of electronic parts of the present invention.

Figure 10:
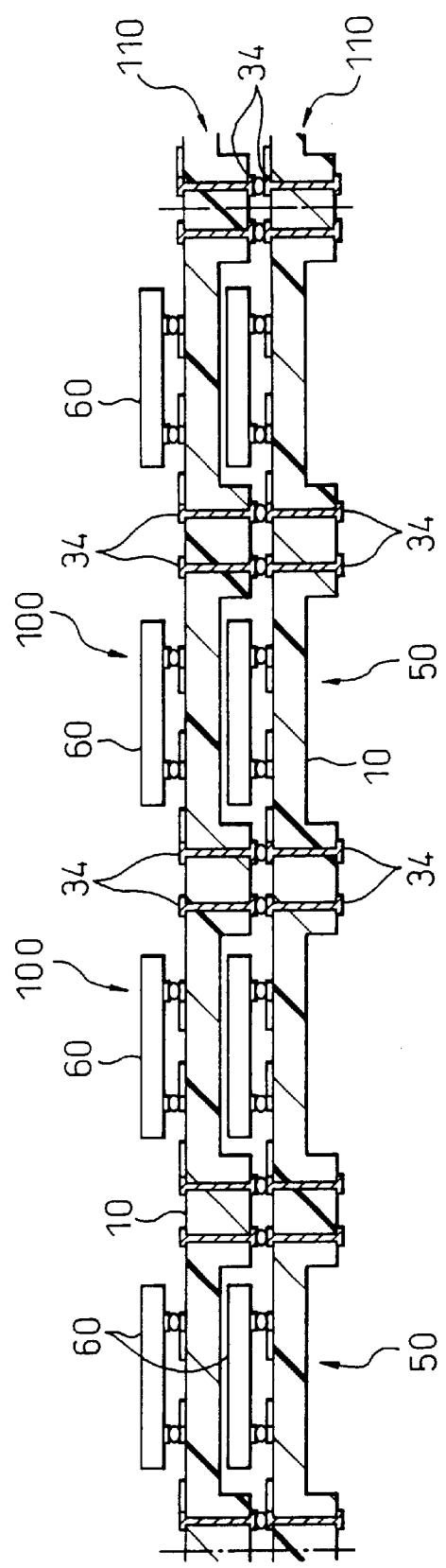
FIG. 10 is an explanatory view of steps of a second method for mounting electronic parts of the present invention.

In this second mount method of electronic parts, as shown in FIG. 10, at least two structures (two in the figure) each obtained by electrically connecting a plurality of leadless type semiconductor chips or other electronic parts 60 to the conductor pad 32 provided on the interconnection circuit 30 of the top surface of each unit interconnection substrate 100 of the interconnection substrates 110 shown in FIG. 2 and arranging and mounting the plurality of electronic parts 60 on the interconnection substrates 110 are formed.

Then, step a of the second mount method of the electronic parts of the present invention is carried out.

Then, as shown in FIG. 10, the interconnection substrates 110 with the plurality of electronic parts 60 arranged and mounted thereon are superposed on each other in two or more stages (two stages in the figure). Then, the connection terminals 34 of the interconnection substrates 110 vertically superposed on each other are electrically connected to each other by soldering or the like. Together with this, the plurality of electronic parts 60 arranged and mounted on the lower interconnection substrate 110 are held in the plurality of depressions 50 arranged in the bottom surface of the upper interconnection substrate 110.

Then, step b of the second mount method of the electronic parts of the present invention is carried out.

Then, as indicated by the one-dot chain line in FIG. 10, predetermined unit interconnection substrates 100 of the interconnection substrates 110 with the plurality of electronic parts 60 arranged and mounted thereon superposed on each other in two or more stages are cut leaving the substrates vertically continuous by using a slicer or the like. Then, interconnection substrates 110 having the predetermined number of the unit interconnection substrates 100 with the electronic parts 60 mounted thereon superposed on each other in two or more stages (two stages in the figure) are formed.

Then, step c of the second mount method of electronic parts of the present invention is carried out.

Thereafter, as shown in FIG. 6, the connection terminals 34 provided on the bottom surface of the lowermost interconnection substrate 110 of the interconnection substrates 110 having the predetermined number of the unit interconnection substrates 100 with the electronic parts mounted 60 thereon superposed on each other in two or more stages are electrically connected to the corresponding connection pads 94 on the top surface of the mount substrate 80 by soldering or the like.

Together with this, the plurality of electronic parts 60 arranged and mounted on the mount substrate 80 are held in the depressions 50 arranged in the bottom surface of the lowermost interconnection substrate 110.

Then, step d of the second mount method of electronic parts of the present invention is carried out.

Then, the second mount structure of electronic parts of the present invention as shown in FIG. 6 formed by mounting the plurality of electronic parts 60 on the mount substrate 80 while being superposed on each other in three or more stages and laterally arranged is obtained.

This second mount method of the electronic parts comprises the above steps.

In this second mount method of electronic parts, the second mount structure of electronic parts of the present invention formed by mounting the plurality of electronic parts 60 on the mount substrate 80 while being superposed on each other in three or more stages and arranged in the lateral direction or the like via the interconnection substrates 110 having the predetermined number of the unit interconnection substrates 100 can be easily formed without trouble.

Next, a preferred embodiment of the method of manufacture of the first electronic device of the present invention will be explained.

Figure 11:
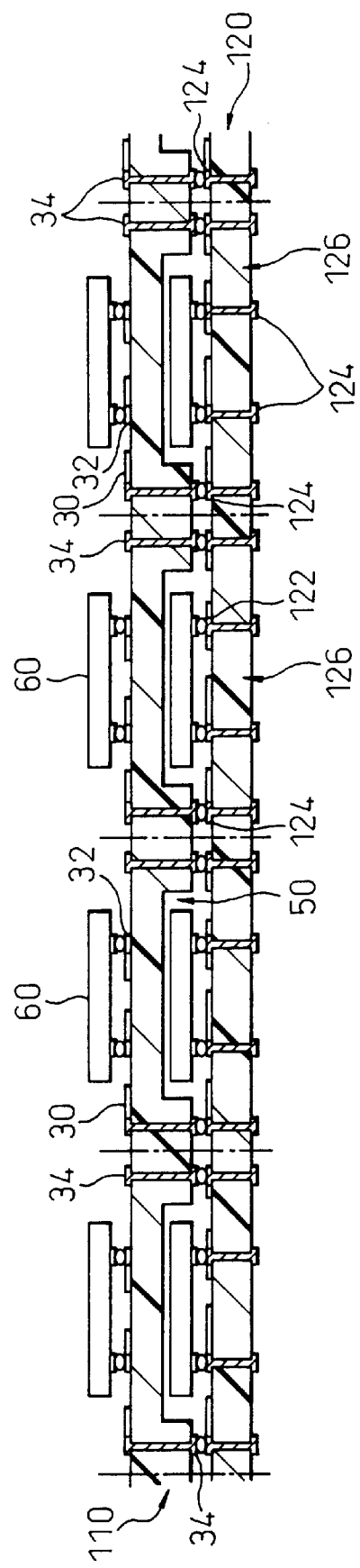
FIG. 11 is an explanatory view of steps of a method of manufacturing the first electronic device of the present invention.

In this method of manufacture of the first electronic device, as shown in FIG. 11, each of the plurality of leadless type semiconductor chips or other electronic parts 60 is electrically connected to the conductor pads 32 provided on the interconnection circuit 30 of the top surface of each unit interconnection substrate 100 of the interconnection substrate 110 shown in FIG. 2. Then, the plurality of electronic parts 60 are arranged and mounted on the interconnection substrate 110.

Then, step a of the method of manufacture of the first electronic device of the present invention is carried out.

Then, as shown in same FIG. 11, the connection terminals 34 provided on the bottom surface of the interconnection substrate 110 with the electronic parts 60 arranged and mounted thereon are electrically connected to the corresponding connection pads 124 provided on the top surface of the interposer 120 by soldering or the like.

Together with this, the plurality of electronic parts 60 connected to the conductor pads 122 of the top surface of the interposer 120 and arranged and mounted on the interposer 120 are held in the depressions 50 arranged the bottom surface of the interconnection substrate 110.

Then, step b of the method of manufacture of the first electronic device of the present invention is carried out.

Thereafter, as indicated by the one-dot chain line in FIG. 11, the predetermined unit interconnection substrates 100 of the interconnection substrate 110 with the plurality of electronic parts 60 arranged and mounted thereon and the unit interposers 126 beneath them are cut while leaving the vertically continuous by using a slicer or the like.

Then, step c of the method of manufacture of the first electronic device of the present invention is carried out.

Then, the first electronic device as shown in FIG. 7 formed by mounting a plurality of electronic parts 60 on the unit interposer 126 or the interposer 120 while being superposed on each other in two stages is obtained.

This method of manufacture of the first electronic device comprises the above steps.

In this method of manufacture of the first electronic device, the first electronic device of the present invention formed by mounting a plurality of electronic parts 60 on the unit interposer 126 or the interposer 120 while being superposed on each other in two stages and laterally arranged or the like via the interconnection substrate 110 having the predetermined number of the unit interconnection substrates 100 can be easily formed without trouble.

Next, a preferred embodiment of the method of manufacture of the second electronic device of the present invention will be explained.

In this method of manufacture of the second electronic device, as shown in FIG. 12, two or more (two in the figure) structures obtained by electrically connecting each of the plurality of leadless type semiconductor chips or other electronic parts 60 to the conductor pads 32 of the interconnection circuit 30 of the top surface of each unit interconnection substrate 100 of the interconnection substrate 110 shown in FIG. 2 and arranging and mounting the plurality of electronic parts 60 on the interconnection substrate 110 are formed.

Then, step a of the method of manufacture of the second electronic device of the present invention is carried out.

Then, as shown in same FIG. 12, the interconnection substrates 110 with the plurality of electronic parts 60 arranged and mounted thereon are superposed on each other in two or more stages (two stages in the figure). Then, the connection terminals 34 of the interconnection substrates 110 vertically superposed on each other are electrically connected to each other by soldering or the like.

Together with this, the plurality of electronic parts 60 arranged and mounted on the lower interconnection substrate 110 are held in the plurality of depressions 50 arranged in the bottom surface of the upper interconnection substrate 110.

Then, step b of the method of manufacture of the second electronic device of the present invention is carried out.

Then, as shown in same FIG. 12, the connection terminals 34 of the bottom surface of the lowermost interconnection substrate 110 among the interconnection substrates 110 with the electronic parts 60 arranged and mounted thereon superposed on each other in two or more stages are electrically connected to the corresponding connection pads 124 provided on the top surface of the interposer 120 by soldering or the like.

Together with this, the plurality of electronic parts 60 connected to the conductor pad 122 of the top surface of the interposer 120 and arranged and mounted on the interposer 120 are held in the depressions 50 arranged in the bottom surface of the lowermost interconnection substrate 110.

Then, step c of the method of manufacture of the second electronic device of the present invention is carried out.

Thereafter, as indicated by the one-dot chain line in the FIG. 12, the predetermined unit interconnection substrates 100 of the interconnection substrate 110 with the plurality of electronic parts 60 arranged and mounted thereon superposed on each other in two or more stages and the unit interposers 126 beneath them are cut while leaving them vertically continuous by using a slicer or the like.

Then, step d of the method of manufacture of the second electronic device of the present invention is carried out.

Then, the second electronic device of the present invention as shown in FIG. 8 formed by mounting a plurality of electronic parts 60 on the unit interposer 126 or the interposer 120 while being superposed on each other in three or more stages is obtained.

This method of manufacture of the second electronic device comprises the above steps.

In this method of manufacture of the second electronic device, the second electronic device of the present invention formed by mounting a plurality of electronic parts 60 on the unit interposer 126 or the interposer 120 while being superposed on each other in three or more stages and laterally arranged or the like via the interconnection substrate 110 having the predetermined number of the unit interconnection substrates 100 can be easily formed without trouble.

Summarizing the effects of the invention, as explained above, if the first or second mount structure of electronic parts of the present invention is formed according to the first or second mount method of electronic parts of the present invention or the first or second electronic device of the present invention is formed according to the method of manufacture of the first or second electronic device of the present invention is formed by using the unit interconnection substrates or interconnection substrates of the present invention, a mount structure of the electronic parts or the electronic device formed by mounting leadless type semiconductor chips or other electronic parts on the mount substrate, unit interposer, or the interposer via the unit interconnection substrate or the interconnection substrate of the present invention while being superposed on each other in two or more stages and arranged in the lateral direction or the like can be easily and quickly formed without trouble.

While the invention has been described by reference to specific embodiments chosen for purposes of illustration, it should be apparent that numerous modifications could be made thereto by those skilled in the art without departing from the basic concept and scope of the invention.

What is claimed is:

1. A method for mounting electronic parts comprising the steps of:
   electrically connecting electronic parts to conductor pads provided on interconnection circuits of top surfaces of unit interconnection substrates of an interconnection substrate of the present invention and mounting the electronic parts on said interconnection substrate,
   cutting the interconnection substrate between predetermined unit interconnection substrates thereof with said electronic parts mounted thereon to form interconnection substrates each having a predetermined number of unit interconnection substrates with the electronic parts mounted thereon, and
   electrically connecting the connection terminals provided on a bottom surface of the interconnection substrate having a predetermined number of the unit interconnection substrates with said electronic parts mounted thereon to the corresponding connection pads of the mount substrate and holding the electronic parts mounted on the mount substrate in the depressions of the bottom surface of said interconnection substrate.

2. A method for mounting electronic parts comprising the steps of:
   forming at least two interconnection substrates each obtained by electrically connecting electronic parts to conductor pads provided on interconnection circuits of top surfaces of unit interconnection substrates of an interconnection substrate and mounting the electronic parts on said interconnection substrate,
   superposing the interconnection substrates with the electronic parts mounted thereon on each other in two or more stages and electrically connecting the connection terminals of upper and lower superposed interconnection substrates to each other and, at the same time, holding the electronic parts mounted on the lower interconnection substrates in the depressions of the bottom surface of the upper interconnection substrate,
   vertically cutting said interconnection substrates superposed on each other in two or more stages between predetermined unit interconnection substrates thereof to form interconnection substrates each having a predetermined number of the unit interconnection substrates with the electronic parts mounted thereon superposed on each other in two or more stages, and
   electrically connecting the connection terminals provided on the bottom surface of the lowermost interconnection substrate among the interconnection substrates each having the predetermined number of the unit interconnection substrates superposed on each other in two or more stages to the corresponding connection pads of the mount substrate and, at the same time, holding the electronic parts mounted on the mount substrate in the depressions of the bottom surface of said lowermost interconnection substrate.

3. A method of manufacture of an electronic device comprising the steps of:
   electrically connecting electronic parts to conductor pads provided on interconnection circuits of top surfaces of unit interconnection substrates of an interconnection substrate and mounting the electronic parts on said interconnection substrate, wherein the unit interconnection substrate is comprised of:

an insulating substrate, an interconnection circuit provided with connection terminals and conductor pads provided on a top surface of the insulating substrate, a depression for holding an electronic part formed in a bottom surface of said insulating substrate, and connection terminals provided on the bottom surface of the insulating substrate on the periphery of the depression, the connection terminals being electrically connected to the connection terminals provided on said interconnection circuit via conductor through holes or conductor via holes provided in said insulating substrate, and wherein the interconnection substrate comprises a plurality of the unit interconnection substrates integrally formed arranged in many columns or one column, electrically connecting the connection terminals provided on the bottom surface of said interconnection substrate to the connection pads of the top surface of the interposer and holding the electronic parts mounted on the interposer in the depressions of the bottom surface of said interconnection substrate electrically connected to the conductor pads of the top surface of said interposer, and vertically cutting the interconnection substrate with said electronic parts mounted thereon and unit interposers beneath the same, between predetermined unit interconnection substrates of the interconnection substrate.

4. A method of manufacture of an electronic device comprising the steps of:

forming at least two structures each obtained by electrically connecting electronic parts to conductor pads provided on interconnection circuits of top surfaces of unit interconnection substrates of an interconnection substrate and mounting the electronic parts on said interconnection substrate, superposing the interconnection substrates with the electronic parts mounted thereon on each other in two or more stages and electrically connecting the connection terminals of the upper and lower superposed interconnection substrates to each other and, at the same time, holding the electronic parts mounted on the lower interconnection substrate in the depressions of the bottom surface of the upper interconnection substrate, electrically connecting the connection terminals provided on the bottom surface of the lowermost interconnection substrate of said interconnection substrates superposed on each other in two or more stages to the connection pads of the top surface of an interposer and, at the same time, holding the electronic parts mounted on the interposer in the depressions of the bottom surface of said lowermost interconnection substrate, and vertically cutting said interconnection substrates superposed on each other in two or more stages and the unit interposers beneath the same, between predetermined unit interconnection substrates of the interconnection substrate.

* * * * *